(12) United States Patent
Furuie

(10) Patent No.: US 10,784,315 B2
(45) Date of Patent: Sep. 22, 2020

(54) DISPLAY DEVICE

(71) Applicant: Japan Display Inc., Tokyo (JP)

(72) Inventor: Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/727,434

(22) Filed: Dec. 26, 2019

(65) Prior Publication Data

US 2020/0227487 A1 Jul. 16, 2020

(30) Foreign Application Priority Data

Jan. 10, 2019 (JP) .................................. 2019-002940

(51) Int. Cl.
| | |
|---|---|
| *H01L 35/24* | (2006.01) |
| *H01L 51/00* | (2006.01) |
| *H01L 27/32* | (2006.01) |
| *H01L 51/50* | (2006.01) |
| *H01L 51/52* | (2006.01) |

(52) U.S. Cl.
CPC ........ *H01L 27/322* (2013.01); *H01L 51/5012* (2013.01); *H01L 51/5237* (2013.01); *H01L 2251/301* (2013.01); *H01L 2251/558* (2013.01)

(58) Field of Classification Search
CPC H01L 27/322; H01L 51/5012; H01L 51/5237
USPC .......................................................... 257/40
See application file for complete search history.

(56) References Cited

U.S. PATENT DOCUMENTS

| | | | |
|---|---|---|---|
| 9,661,231 B2* | 5/2017 | Tsuge | G03B 17/14 |
| 10,003,045 B2* | 6/2018 | Suzuki | H01L 51/5259 |
| 2020/0152709 A1* | 5/2020 | Jeong | G06F 3/044 |

FOREIGN PATENT DOCUMENTS

| | | |
|---|---|---|
| JP | 2001-196172 A | 7/2001 |
| JP | 2001196172 A * | 7/2001 |

* cited by examiner

*Primary Examiner* — David S Blum
(74) *Attorney, Agent, or Firm* — Michael Best & Friedrich LLP

(57) ABSTRACT

A display device including a first substrate, a second substrate opposing the first substrate, a display region including a plurality of light emitting elements arranged above the first substrate, a color filter layer arranged on the second substrate in the display region including a plurality of light emitting elements, the color filter layer overlapping each of the plurality of light emitting elements respectively, a coating layer arranged between the color filter layer and the second substrate, a first inorganic insulating layer arranged above the plurality of light emitting elements, a second inorganic insulating layer above the first inorganic insulating layer, a first organic insulating arranged between the first inorganic insulating layer and the second inorganic insulating layer in a periphery region surrounding the display region, and a filler material surrounding the periphery region and filling a space, wherein the coating layer does not overlap the first organic insulating layer.

11 Claims, 10 Drawing Sheets

DISPLAY DEVICE

CROSS REFERENCE TO RELATED APPLICATIONS

This application is based upon and claims the benefit of priority from the prior Japanese Patent Application No. 2019-002940, filed on Jan. 10, 2019, the entire contents of which are incorporated herein by reference.

FIELD

One embodiment of the present invention is related to a display device.

BACKGROUND

Liquid crystal display devices which use the electro-optic effect of liquid crystals and organic electroluminescence display devices that use organic electroluminescence (organic EL) elements as which are used in electrical appliances and electronic devices are being developed. These display devices are formed with a display screen having a plurality of pixels arranged on a substrate. Each pixel of the display device is arranged with a liquid crystal element or an organic EL element and the like as a display element.

As a method for obtaining high definition in a display which uses an organic EL element, a technology is disclosed in Japanese Laid-Open Patent Application No. 2001-196172 in which white light emitted from an organic EL display element is emitted as red light, green light or blue light using a color filter.

SUMMARY

One embodiment of the present invention provides a display device including a first substrate, a second substrate opposing the first substrate, a display region including a plurality of light emitting elements arranged above the first substrate, a color filter layer arranged on the second substrate in the display region including a plurality of light emitting elements, the color filter layer overlapping each of the plurality of light emitting elements respectively, a coating layer arranged between the color filter layer and the second substrate, a first inorganic insulating layer arranged above the plurality of light emitting elements, a second inorganic insulating layer above the first inorganic insulating layer, a first organic insulating arranged between the first inorganic insulating layer and the second inorganic insulating layer in a periphery region surrounding the display region, and a filler material surrounding the periphery region and filling a space between the first substrate and the second substrate, wherein the coating layer does not overlap the first organic insulating layer.

DESCRIPTION OF EMBODIMENTS

Figure 1:
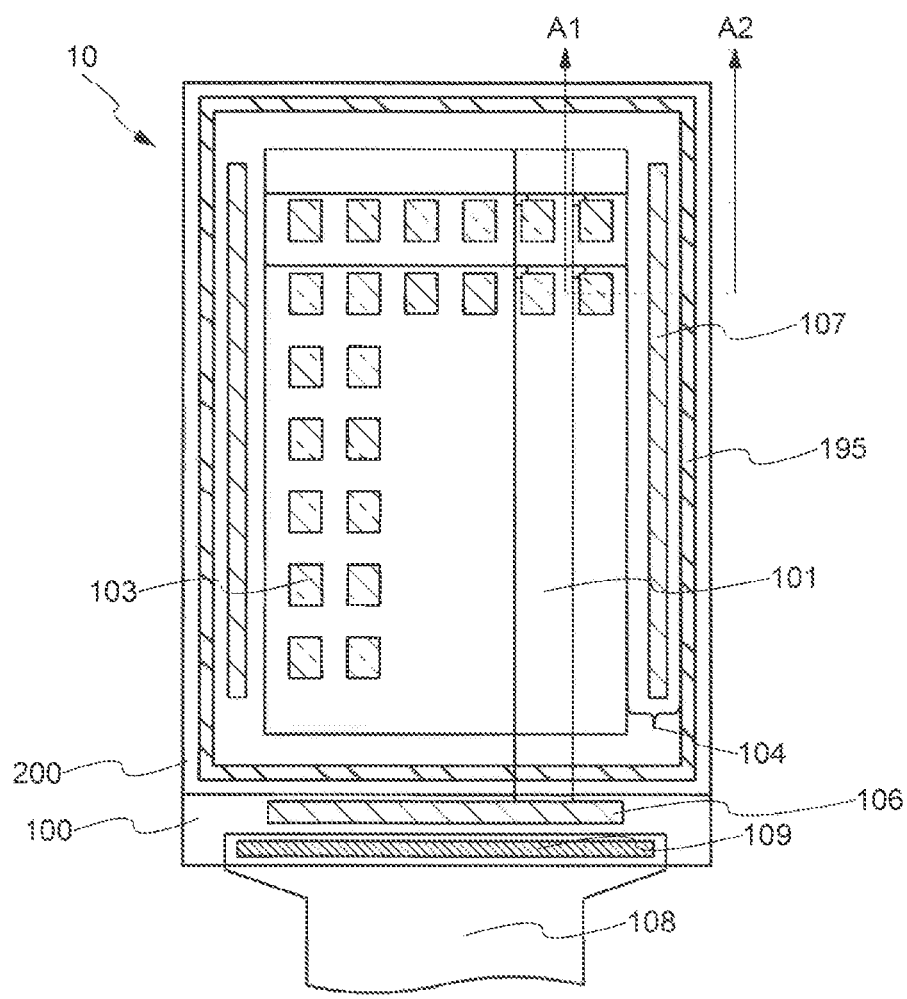
FIG. 1 is a top diagram showing a structure of a display device related to one embodiment of the present invention.

The embodiments of the present invention are explained below while referring to the drawings. However, the present invention can be implemented in various modes and the disclosure and should not to be interpreted as being limited to the description of the embodiments exemplified below. In addition, although the drawings may be schematically represented in terms of width, thickness, shape, and the like of each part as compared with their actual mode in order to make an explanation clearer, it is only an example and an interpretation of the present invention is not limited. In addition, in the present specification and each drawing, the same reference numerals (or symbols such as a, b which are attached numerals) after are provided to the same elements as those described above with reference to preceding figures and a detailed explanation may be omitted accordingly. Furthermore, characters such [first] and [second] attached to each element are appropriate symbols for use in distinguishing each element and do not have any further meaning unless otherwise stated.

In addition, in the present specification, in the case when a certain member or region is [above (or below)] another member or region, unless otherwise specified this also includes the case where it is directly above (or directly below) the other member or region as well as above (or below) other members or regions, that is, the case where another component is included above (or below) other members or regions is also included. Furthermore, in the explanation herein, unless otherwise specified, the side on which the second substrate is arranged with respect to the first substrate is called [upper] or [above] in a cross-sectional view and the reverse is called as [downward] or [below].

In addition, in the present specification, A and B are connected to each other also includes A and B being directly connected as well as being electrically connected. Here, A and B are electrically connected means that when an object which has some electrical action exists between A and B, it is possible to send and receive electrical signals between A and B.

Other than what is described above, in the case where it can be recognized by a person having ordinary knowledge in the field to which the present invention belongs, no special explanation is provided.

Organic EL elements are known to deteriorate because of moisture. As a result, a sealing layer using an insulating layer is arranged above an organic EL element. The thicker the sealing layer, the higher the effect of protecting the organic EL element from moisture. However, in the case when the thickness of the sealing layer is increased, the distance between the organic EL element and a color filter is increased, and the viewing angle characteristics deteriorate. On the other hand, when the thickness of the sealing layer is decreased, there is a danger that defects may occur in the sealing layer, and the organic EL element may deteriorate because of moisture. As a result, it is necessary to increase the distance from the end of the substrate to a display part in order to prevent moisture from reaching the organic EL element. As a result, a periphery region (or frame part) of the display device is expanded.

One aim of one embodiment of the present disclosure is to provide a display device which has good viewing angle characteristics and high reliability.

First Embodiment (1-1. Structure of Display Device)

FIG. 1 shows a top diagram of a display device 10. In FIG. 1, the display device 10 includes a substrate 100, a substrate 200, a display region 101 including a plurality of pixels 103, a periphery region 104, a drive circuit 106 including a function as a source driver, a drive circuit 107 including a function as a gate driver, a flexible printed circuit substrate 108, a terminal part 109 and a dam member 195.

In FIG. 1, pixels 103 are arranged in a matrix and include a display element (light emitting element 130 described later). The periphery region 104 is arranged on the outer side of the display region 101 and is arranged to surround the display region 101. The dam member 195 is arranged on the outer side of the periphery region 104 and is arranged to surround the periphery region 104. The pixel 103, the drive circuit 106, the drive circuit 107 and the flexible printed circuit substrate 108 are electrically connected to each other. Data (signal) from an external device is input to the drive circuit 106 and the drive circuit 107 via the flexible printed circuit substrate 108 and the terminal part 109.

Figure 2:
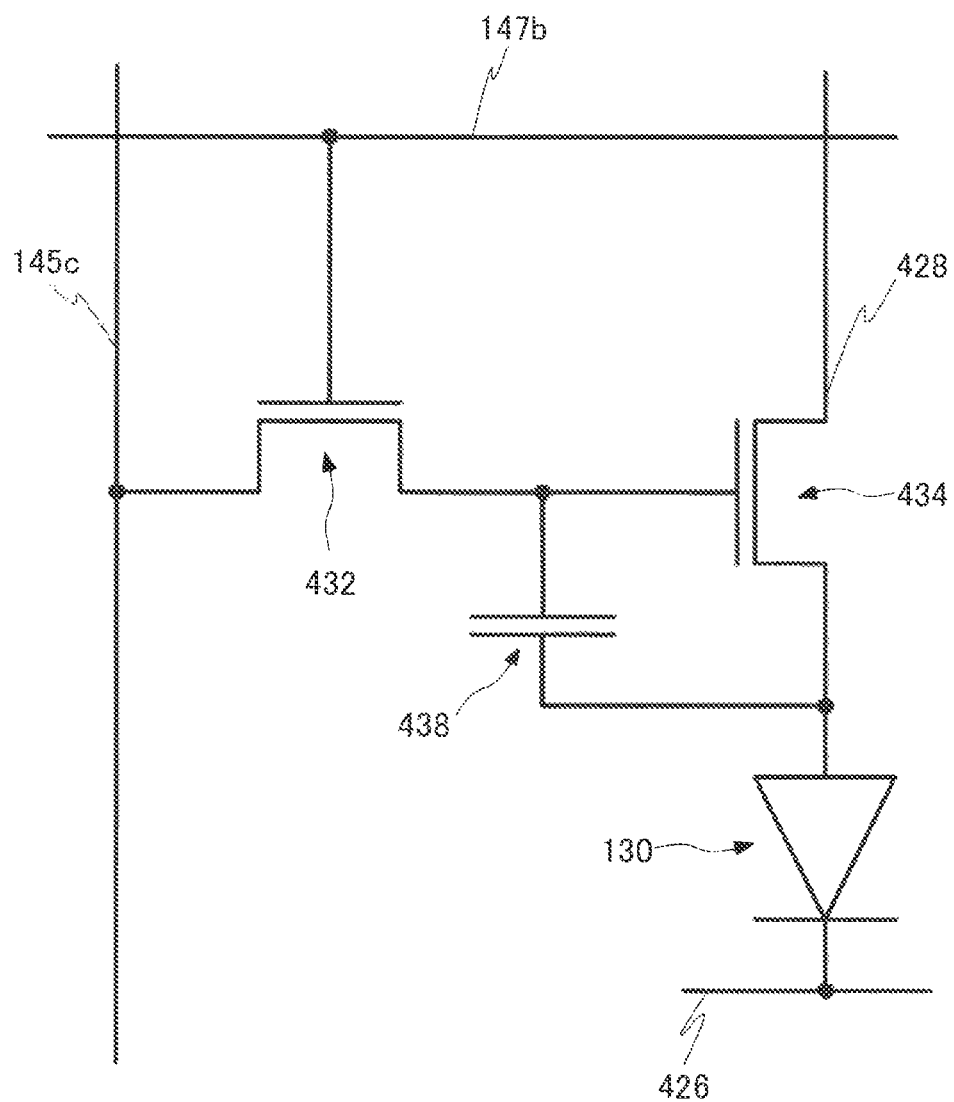
FIG. 2 is a circuit diagram of a pixel circuit related to one embodiment of the present invention.

A circuit diagram of the pixel circuit 430 of the pixel 103 which is included in the display device 10 is shown in FIG. 2. Furthermore, the circuit structure of the pixel circuit 430 explained below is an example and the present invention is not limited to this example.

Each of the plurality of pixel circuits 430 includes at least a drive transistor 434, a selection transistor 432, a light emitting element 130 and a storage capacitor 438.

The drive transistor 434 is a transistor which is connected to the light emitting element 130 and controls the light emitting luminosity of the light emitting element 130. In the drive transistor 434, a drain current is controlled by a gate/source voltage. In the drive transistor 434, the gate is connected to the drain of the selection transistor 432, the source is connected to a drive power supply line 428, and the drain is connected to an anode of the light emitting element 130.

The selection transistor 432 is a transistor which controls a conduction state between a signal line 147b which transmits a video signal from the drive circuit 106 and the gate of the drive transistor 434 by a switching operation. In the selection transistor 432, the gate is connected to a scanning line 145c which transmits a scanning signal, the source is connected to a signal line 147b, and the drain is connected to the gate of the drive transistor 434.

In the light emitting element 130, the anode is connected to the drain of the drive transistor 434 and the cathode is connected to a reference power supply line 426.

The storage capacitor 438 is connected between the gate and drain of the drive transistor 434. The storage capacitor 438 holds the gate-drain voltage of the driving transistor 434.

The reference power supply line 426 is arranged in common for a plurality of pixels 103. A constant potential is applied to the reference power supply line 426.

Based on the structure described above, a video signal transmitted from the drive circuit 106 and a scanning signal transmitted from the drive circuit 107 are input to respective pixels 103 whereby a still image and a moving image are displayed in the display region 101.

(1-2. Cross-Sectional Structure of Display Device)

Hereinafter, a cross-sectional structure including each component of the display device 10 will be described with reference to the drawings.

Figure 3:
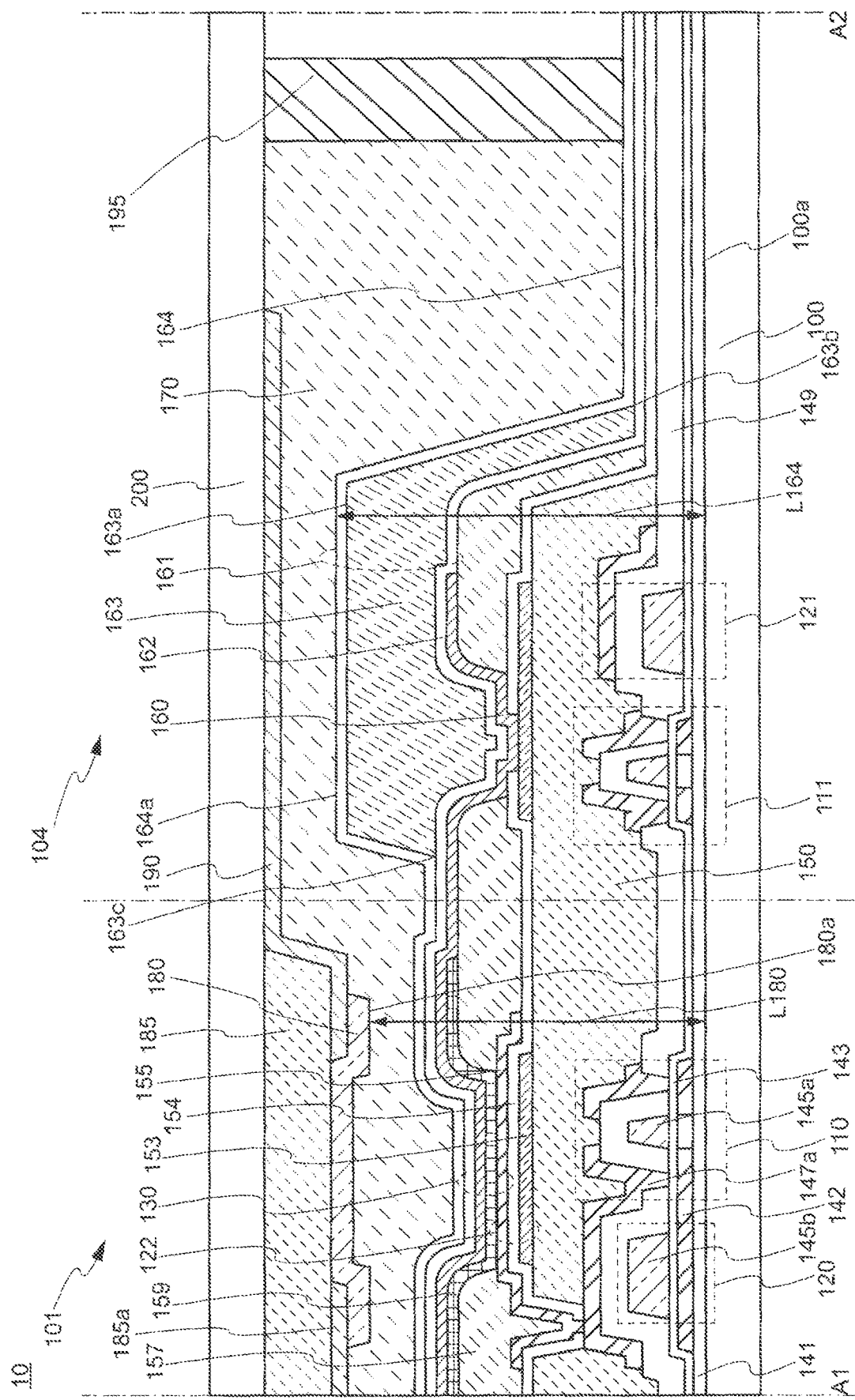
FIG. 3 is a cross-sectional diagram showing a structure of a display device related to one embodiment of the present invention.

FIG. 3 is a cross-sectional diagram along the line A1-A2 in the display device 10 shown in FIG. 1. In FIG. 3, the display device 10 includes a display region 101, a periphery region 104 and a dam member 195.

In the display region 101, the display device 10 includes a substrate 100, a transistor 110, a capacitor 120, a light emitting element 130, an insulating layer 141, an insulating layer 149, a planarization layer 150, a rib 157, a sealing layer 161, a filler material 170, a color filter layer 180, a light shielding layer 190, a coating layer 185 and a substrate 200. In addition, in the periphery region 104, the display device 10 includes the substrate 100, the transistor 111, the capacitor 121, the insulating layer 141, the insulating layer 149, the planarization layer 150, the rib 157, the sealing layer 161, the filler material 170, the light shielding layer 190 and the substrate 200. Each structure is explained in detail below.

The transistor 110 corresponds to the drive transistor 434 in FIG. 2. The transistor 111 corresponds to a transistor which is used for the drive circuit 107. The transistor 110 and the transistor 111 include a semiconductor layer 142, a gate insulating layer 143, a gate electrode 145a and a source/drain electrode 147a. Although the transistors 110 and 111 have a top gate/top contact structure, they are not limited to this structure and may have a bottom gate structure or a bottom contact structure.

The source or drain region of the semiconductor layer 142 and the capacitor electrode 145b are used with the gate insulating layer 143 as a dielectric for the capacitor 120 and the capacitor 121. In addition, in the capacitor 122, the conductive layer 153 and the pixel electrode 155 are used with the insulating layer 154 as a dielectric. The capacitor 122 corresponds to the capacitor 438 shown in FIG. 2.

A pixel electrode 155, an organic EL layer 159 and a counter electrode 160 are used for the light emitting element 130. The light emitting element 130 has a so-called top emission type structure which emits white light emitted from the organic EL layer 159 to a counter electrode 160 side.

The sealing layer 161 is arranged above the light emitting element 130, the rib 157 and the insulating layer 154. The sealing layer 161 includes an inorganic insulating layer 162 and an inorganic insulating layer 164. The inorganic insulating layer 162 and the inorganic insulating layer 164 extend from the display region 101 to the periphery region 104.

Insulating films such as silicon nitride, silicon oxide, silicon oxynitride, and aluminum oxide are used for the inorganic insulating layer 162 (also called a first inorganic insulating layer) and the inorganic insulating layer 164 (also called a second inorganic insulating layer). The film thicknesses of the inorganic insulating layer 162 and the inorganic insulating layer 164 are preferably 30 nm or more and 1 μm or less.

By adopting the structure described above, even if a defect such as a pinhole is formed in one part, another inorganic insulating layer can compensate for the defect and more effectively suppress the entrance of moisture.

In addition, the sealing layer 161 further includes an organic insulating layer 163 between the inorganic insulating layer 162 and the inorganic insulating layer 164 in the periphery region 104. It is preferred that an end part of the organic insulating layer 163 is tapered. It is preferred that the corner part of the end part of the organic insulating layer 163 is rounded.

Materials such as acrylic resin, polyimide resin and epoxy resin can be used for the organic insulating layer 163. It is preferred that the film thickness of the organic insulating layer 163 is 1 μm or more and 20 μm or less, and more preferably 3 μm or more and 10 μm or less.

By including the organic insulating layer 163 between the inorganic insulating layer 162 and the inorganic insulating layer 164, since the surface of the organic insulating layer 163 is planarized even when foreign matter is mixed in when forming the sealing layer 161, it is possible to increase the coverage of the inorganic insulating layer 164. Therefore, the sealing layer 161 can stably maintain a moisture blocking performance.

In addition, an end part 163b and an end part 163c of the organic insulating layer 163 are arranged between the end part of the display region 101 and the dam member 195.

The color filter layer 180 is arranged on the substrate 200 side. The color filter layer 180 has a function for transmitting light in a specific wavelength band with respect to light emitted from the light emitting element 130. For example, it is possible to emit light in the red, green, or blue wavelength bands.

The light shielding layer 190 is arranged on the substrate 200 side. The light shielding layer 190 has a function for shielding light. For example, in addition to a resin in which a pigment is dispersed and a resin which includes a dye, it is also possible to use an inorganic film such as a black chrome film, carbon black, a composite oxide including a solid solution of a plurality of inorganic oxides or the like.

The filler material 170 is arranged to fill a space between the substrate 100 and the substrate 200 in the display region 101 and the periphery region 104. Specifically, the filler material 170 is arranged between the inorganic insulating layer 164 and the color filter layer 180 or the light shielding layer 190.

An organic insulating material such as acrylic resin or epoxy resin is used for the filler material 170. The filler material 170 has a higher shielding property to moisture than the planarization layer 150 and the insulating layer 149. In addition, by arranging the filler material 170, it is possible to suppress the reflection of light incident from the outside and stabilize the optical characteristics of the display device. In addition, in the case where a photocurable organic resin is used for the filler material 170, the curing speed of the material is high, and therefore it is possible to reduce the work time for bonding.

The dam member 195 is arranged to surround the outer side of the filler material 170. The dam member 195 is filled and arranged between the substrate 100 and the substrate 200 which opposes the substrate 100. The dam member 195 has a high blocking effect against moisture from the side surface of the display device 10.

An inorganic material, an organic material or a composite material of an organic material and an inorganic material is used for the dam member 195. For example, a resin material such as an epoxy resin, an acrylic resin, a silicone resin, a phenol resin, a polyimide resin, an imide resin or silica gel, or a filler such as silica, calcium oxide, magnesium oxide or calcium carbonate is used for the dam member 195. More specifically, a material including a flat silica filler is used for the dam member 195.

In the present embodiment, it can be said that the filler material 170 and the dam member 195 have the same function in that they have a function for filling a space between the substrate 100 and the substrate 200 and for blocking moisture. As a result, the filler material 170 is referred to as the first filler material and the dam member 195 is referred to as the second filler material. In the present embodiment, the filler material 170 and the dam member 195 are collectively referred to as a filler material. In the description above, it can be said that the filler material 170 and the dam member 195, that is, the filler material, are arranged to surround at least the outer side of the periphery region 104.

The coating layer 185 is arranged between the color filter layer 180 and the substrate 200 in the display region 101. The thickness of the coating layer 185 is 1 μm or more and 20 μm or less, and preferably 5 μm or more and 10 μm or less. An organic insulating material such as an acrylic resin or an epoxy resin is used for the coating layer 185. The side surface of the coating layer 185 preferably has a forward tapered shape. In addition, it is preferred that the end part of the coating layer 185 has roundness. In this way, it is possible to increase the coverage of the light shielding layer 190 and increase the contrast ratio of the display device 10.

In this case, the coating layer 185 is arranged so as not to overlap the organic insulating layer 163. More specifically, the upper surface 185a of the coating layer 185 and the upper surface 163a of the organic insulating layer 163 are arranged so as not to overlap.

By adopting such as structure, the light emitting element 130 can be more effectively shielded from moisture, and it is possible to reduce the distance between the light emitting element 130 and the color filter layer 180 in the display region. In this way, it is possible to prevent light leakage (color mixing) to an adjacent pixel and improve viewing angle characteristics.

In addition, a distance L180 from the first surface 100a of the substrate 100 to the upper surface 180a of the color filter layer 180 which faces the first surface 100a of the substrate 100 within the color filter layer 180 is preferred to be shorter than a distance L164 from the first surface 100a of the substrate to a part 164a which is contact with the upper surface 163a of the organic insulating layer 163 with the inorganic insulating layer 164. In this way, it is assumed that it is possible to increase the moving distance of moisture which has entered through the dam member 195 and prevent the light emitting element 130 from deterioration.

In the present embodiment, the display device 10 includes the substrate 100 and the substrate 200, the filler material 170 is arranged above the display region 101 of the substrate 200, the dam member 195 is arranged to surround the filler material 170, and the substrate 200 is arranged on the filler material 170 and the dam member 195. In the case where the substrate 100 and the substrate 200 are bonded to each other by the filler material 170 and the dam member 195, the filler material 170, the dam member 195, and the substrate 200 can prevent the organic EL layer 159 from being damaged by moisture in the central portion of the display area 101.

However, the organic EL element is easily damaged by moisture intrusion from the periphery of the display area 101. In the display device of the present embodiment, a countermeasure is taken since it has been found that the light emitting element 130 (organic EL element) no longer emits light from the periphery of the display region 101. Specifically, by adopting a structure in which the organic insulating layer 163 is arranged thickly at the periphery of the sealing layer 161, it is possible to obtain a sealing film structure which is resistant to foreign matter and is more effective is preventing moisture.

Next, each structure of the elements apart from the display device 10 shown in FIG. 3. are explained below.

A glass substrate or an organic resin substrate is used for the substrate 100 (also called a first substrate) and the substrate 200 (also called a second substrate). For example, a polyimide substrate is used as the organic resin substrate. The organic resin substrate can have a film thickness of several micrometers to several tens of micrometers, and it is possible to realize a flexible sheet display. In the case where an organic resin substrate is used for the substrate 100 or the substrate 200, it is desirable that a film is formed with an inorganic material (such as silicon nitride) as the moisture blocking film.

The insulating layer 141 has a function as a base film. Silicon oxide, silicon oxynitride and silicon nitride or the like is used for the insulating layer 141. The insulating layer 141 may be a single layer or a stacked layer. By using materials described above, it is possible to suppress the diffusion of impurities, typically alkali metal, water, hydrogen, or the like from the substrate 100 to the semiconductor layer 142.

Silicon, silicon germanium, an oxide semiconductor, an organic semiconductor or the like is used for the semiconductor layer 142. For example, amorphous silicon, polycrystalline silicon or the like is used as the silicon. For example, an oxide semiconductor (IGZO) containing indium, gallium, and zinc can be used for the oxide semiconductor.

An insulating film having a high dielectric constant such as silicon oxide, silicon oxynitride, or silicon nitride can be used for the gate insulating layer 143.

The gate electrode 145a and the storage electrode 145b are arranged above the gate insulating layer 143. The gate electrode 145a is connected to the scanning line 145c shown in FIG. 1. The gate electrode 145a and the storage electrode 145b are formed from a conductive material selected from tantalum, tungsten, titanium, molybdenum, aluminum and copper or the like. The gate electrode 145a and the storage electrode 145b may have a single layer structure or a stacked structure of the conductive materials described above. For example, a stacked film of titanium and aluminum is used for the gate electrode 145a and the storage capacitor electrode 145b.

The source/drain electrode 147a is arranged above the insulating layer 149 and is connected to the signal line 147b shown in FIG. 1. The source/drain electrode 147a is formed from the same material as the material given as an example of the gate electrode 145a.

It is possible to form the insulating layer 149 and the insulating layer 154 using a material similar to the gate insulating layer 143. The insulating layer 149 and the insulating layer 154 may be a single layer or a stacked layer structure of the materials descried above.

The planarization layer 150 has a function of a planarization film and is arranged above the insulating layer 149 and the source/drain electrodes 147a. The planarization layer 150 is arranged on the lower side of the light emitting element 130. An organic insulating material such as an acrylic resin is used for the planarization layer 150.

The conductive layer 153 is arranged above the planarization layer 150. The conductive layer 153 may be formed using the same material as the gate electrode 145a or a different material may be used.

The insulating layer 154 is arranged above the planarization layer 150 and the conductive layer 153 and the same material as the gate insulating layer 143 is used for the insulating layer 154.

The pixel electrode 155 preferably has a function of an anode of the light emitting element 130 and further has a function for reflecting light. The former function is preferred to be an oxide conductive material such as ITO or IZO, and the latter function is preferred to be a conductive material having high surface reflectivity such as aluminum or silver. In order to achieve both of these functions, a structure is adopted in which an oxide conductive layer such as ITO or IZO is stacked above a conductive layer having high surface reflectivity such as aluminum or silver. The pixel electrode 155 is electrically connected to the source/drain electrode 147a.

The organic EL layer 159 is arranged above the pixel electrode 155 and includes a light emitting material such as an organic electroluminescent material. A hole transport material or an electron transport material may be used together with the light emitting material for the organic EL layer 159. In addition, the organic EL layer 159 of the present embodiment may be arranged by stacking light emitting materials for emitting white light.

The counter electrode 160 has a function of a cathode of the light emitting element 130 and is arranged to continuously cover the pixel electrodes 155 across the plurality of pixel electrodes 155. The counter electrode 160 is required to have translucency, and simultaneously have reflectivity in order to form a microcavity with the reflective surface of the pixel electrode 155. As a result, the counter electrode 160 may be formed as a semipermeable film. Specifically, the counter electrode 160 is formed using a layer which is made of silver, magnesium or an alloy thereof at a thickness which is sufficient to transmit light.

Ribs 157 separate each of the light emitting elements 130 from each other. An organic resin material is used for the rib 157 in order to cover the periphery region of a pixel electrode 155 and form a smooth step at the end part of the pixel electrode 155. In addition, an organic resin material including a black pigment may also be used for the rib 157 in order to increase the contrast ratio of a displayed image.

Furthermore, although an example is shown in the present embodiment in which the inorganic insulating layer 162 and the inorganic insulating layer 164 are stacked on the end part of the rib 157 on the light emitting element 130 side, the present invention is not limited to this example. A part of the organic insulating layer 163 may also remain between the inorganic insulating layer 162 and the inorganic insulating layer 164 at the end part on the light emitting element 130 side of the rib 157. In this way, a step in the rib 157 is eliminated, it is possible to increase the coverage of the inorganic insulating layer 164 and it is possible to maintain moisture blocking performance.

(1-3. Manufacturing Method of Display Device)

Figure 4:
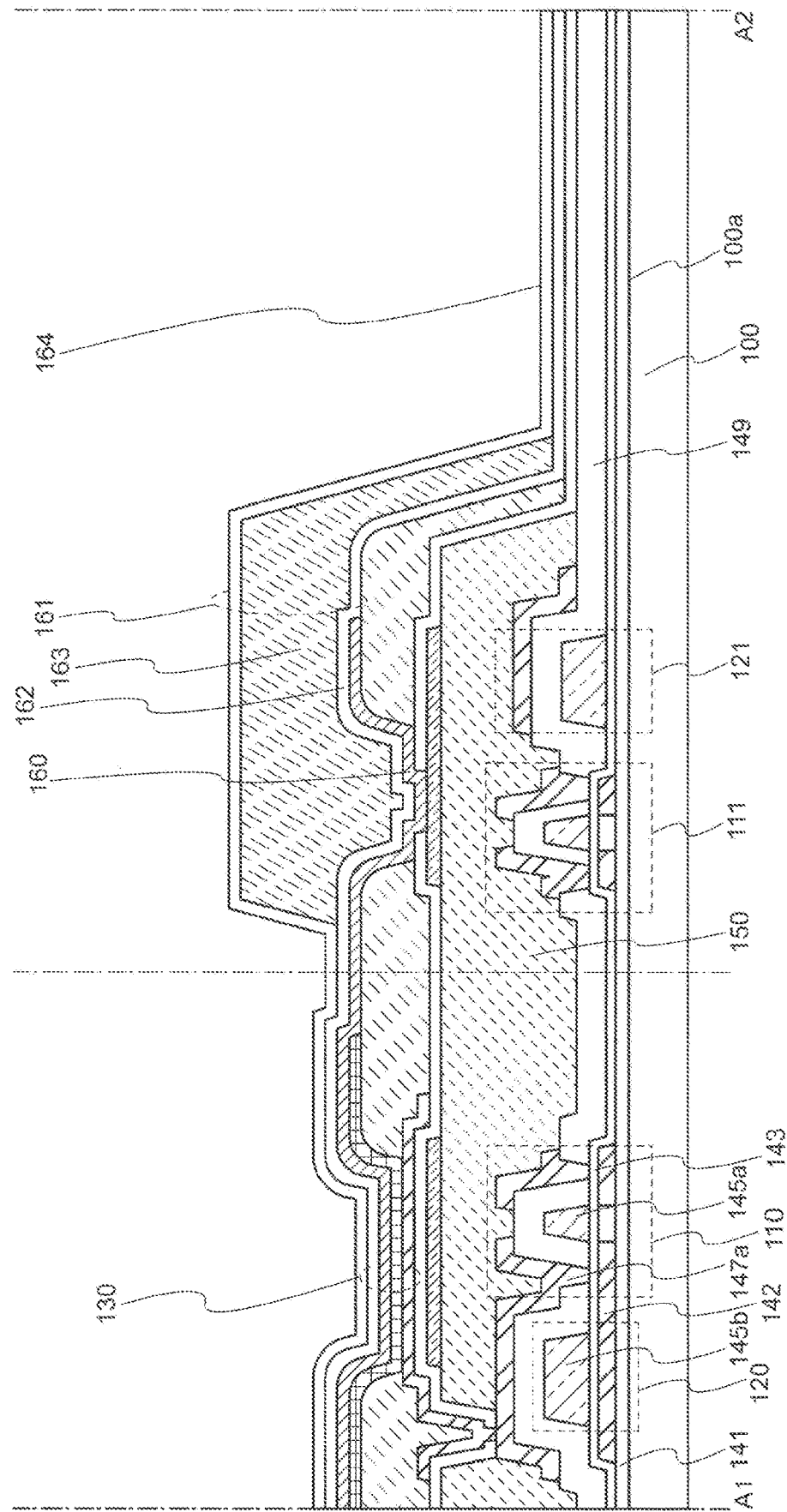
FIG. 4 is a cross-sectional diagram for explaining a manufacturing method of a display device related to one embodiment of the present invention.
Figure 5:
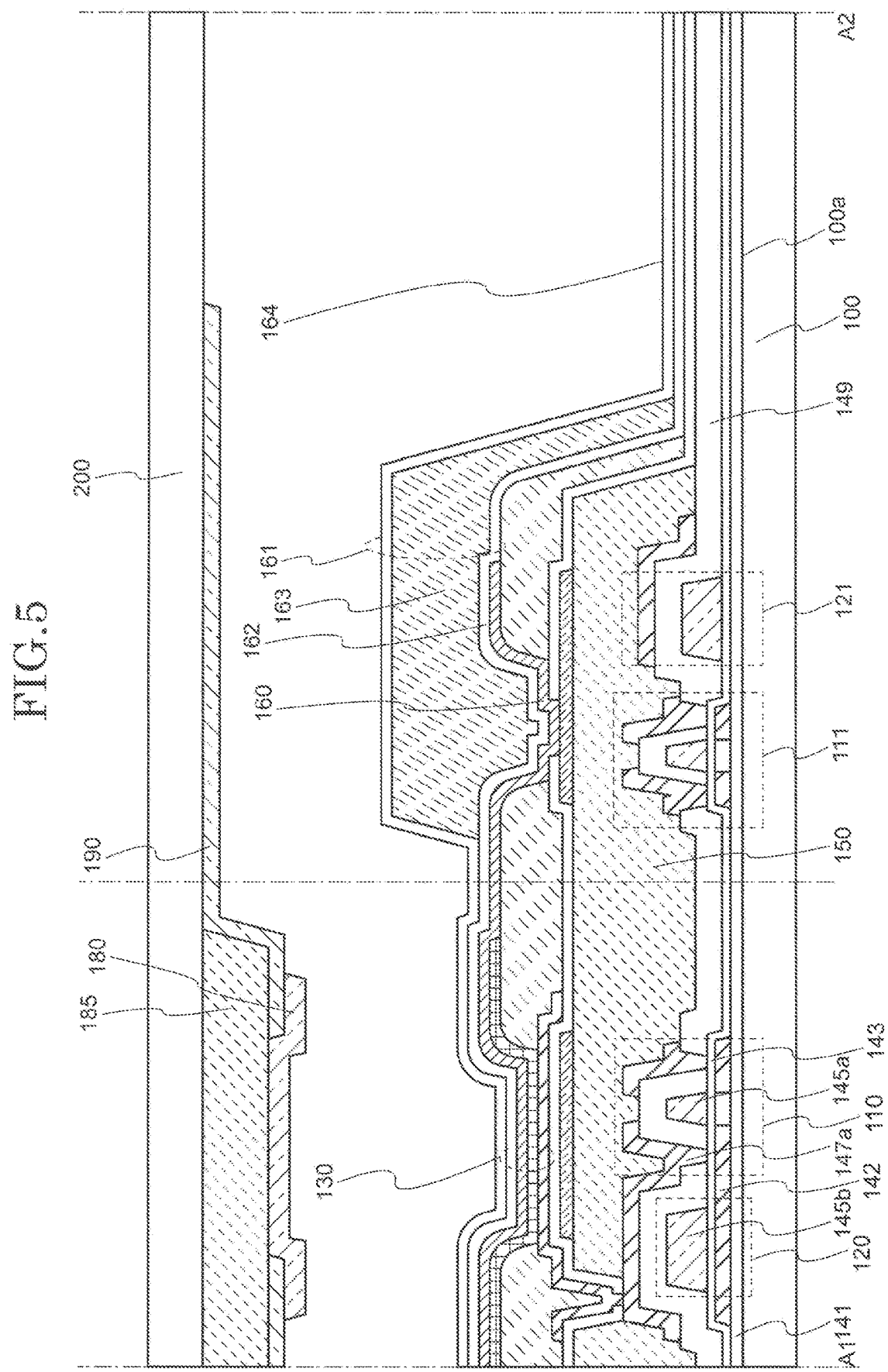
FIG. 5 is a cross-sectional diagram for explaining a manufacturing method of a display device related to one embodiment of the present invention.
Figure 6:
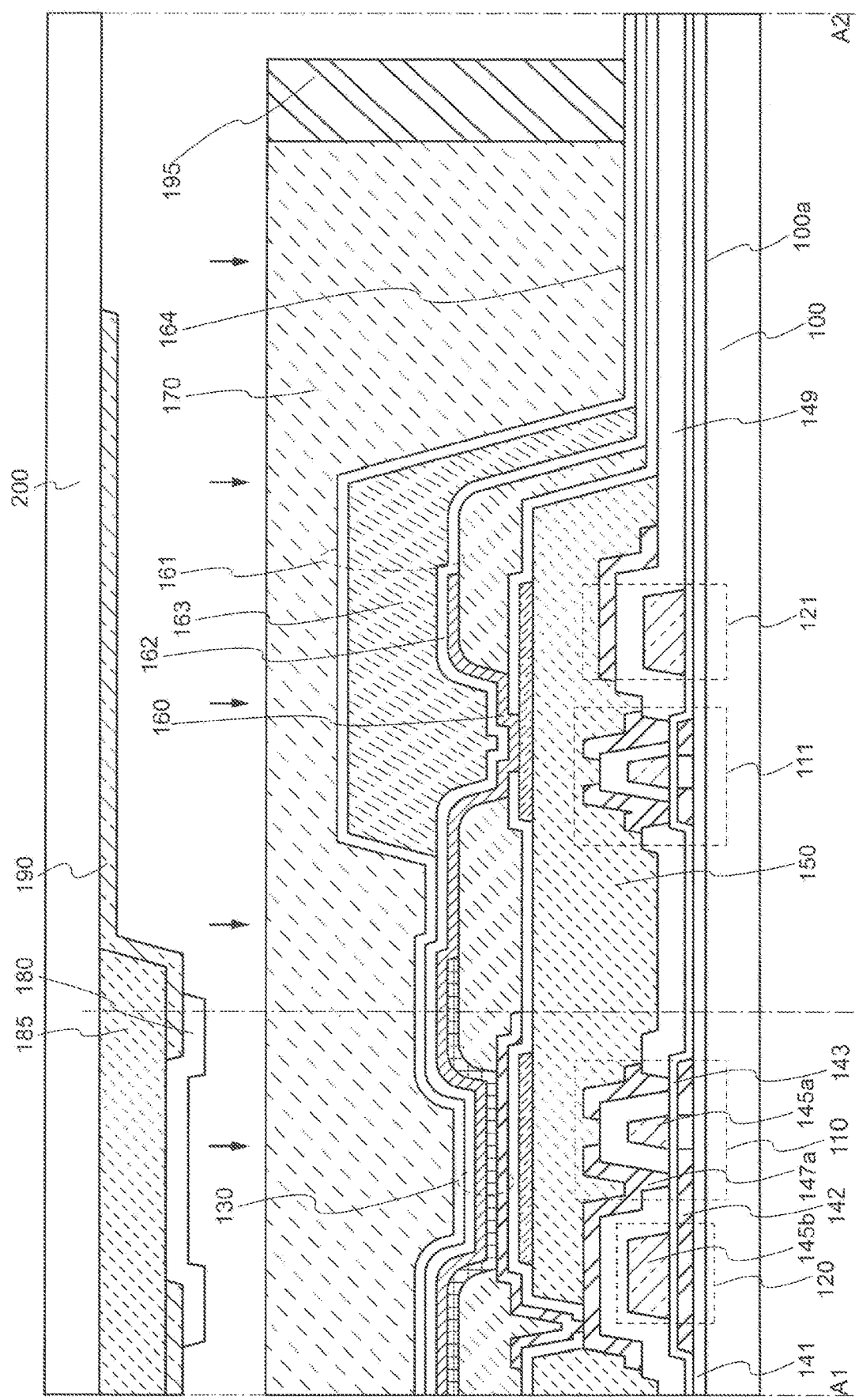
FIG. 6 is a cross-sectional diagram for explaining a manufacturing method of a display device related to one embodiment of the present invention.

Next, a method for manufacturing the display device 10 is explained using FIG. 4 to FIG. 6. Furthermore, since the formation of the transistor 110, the transistor 111, the capacitor 120, the capacitor 121, the capacitor 122 and the light emitting element 130 uses a common method, their explanation is omitted in this embodiment.

(1-3-1. Formation of Sealing Layer)

As is shown in FIG. 4, a sealing layer 161 is formed above the light emitting element 130. First, the inorganic insulating layer 162 is formed above the counter electrode 160. In this case, the display region 101 is preferred to be covered by the inorganic insulating layer 162. The inorganic insulating layer 162 can be formed by a plasma CVD method, a thermal CVD method, an evaporation method, a spin coating method, a spray method or a printing method. For example, a silicon nitride film formed by a plasma CVD method is used as the inorganic insulating layer 162.

Next, an organic insulating layer 163 is formed above the inorganic insulating layer 162 in the periphery region 104. The organic insulating layer 163 is formed so that its thickness is 1 µm or more and 20 µm or less by a screen printing method using, for example, acrylic resin. Furthermore, the method for forming the organic insulating layer 163 is not limited to a screen printing method and the organic insulating layer 163 may also be formed by a spin coating method, an evaporation method, a spray method or an ink jet method and the like. In addition, the organic insulating layer 163 may be appropriately processed by a photolithography method or a dry etching method and the like. In this case, it is preferred that the end part of the organic insulating layer 163 is formed so that it is located between the end part of the display region 101 and the part where the dam member 195 is arranged. After forming the organic insulating layer 163, a heat treatment or photocuring treatment may be performed as appropriate.

Next, an inorganic insulating layer 164 is formed above the organic insulating layer 163 and the inorganic insulating layer 162. The formation method of the inorganic insulating layer 164 may be the same as the formation method of the inorganic insulating layer 162.

(1-3-2. Coating Layer, Light Shielding Layer and Color Filter Layer Formation)

Next, as is shown in FIG. 5, a coating layer 185, a light shielding layer 190 and a color filter layer 180 are formed above the substrate 200.

The coating layer 185 is formed using the same material and method as the organic insulating layer 163. Specifically, the coating layer 185 is formed by screen printing using an acrylic resin. The coating layer 185 is formed at a position overlapping the light emitting element 130 when the substrate 100 and the substrate 200 are bonded together.

The light shielding layer 190 can be formed using a spin coating method, a spray method and an ink jet method or the like. The light shielding layer 190 is formed to have an opening in a region where light from the light emitting element 130 is emitted. For example, a photosensitive organic resin material (black resist) including a black pigment formed by a spin coating method can be used for the light shielding layer 190.

The color filter layer 180 is formed by an inkjet method, a photolithography method, or a screen printing method and the like to be arranged in an opening formed in the light shielding layer 190, that is, a region where light is emitted from the light emitting element 130.

(1-3-3. Bonding of Substrate 100 and Substrate 200)

Next, as is shown in FIG. 6, the substrate 100 and the substrate 200 which is a counter substrate of the substrate 100 are bonded together.

First, a dam member 195 is formed on the substrate 100. A resin material which has a viscosity containing a filler is used as the dam member 195. The dam member 195 is formed in a frame shape so as to form an exterior frame of the display device 10.

Next, a filler material 170 is formed in a region corresponding to the display region 101 and the peripheral region 104 which are surrounded by the dam member 195 above the inorganic insulating layer 164. The filler material 170 is formed using the same material and method as the organic insulating layer 163. By forming the filler material 170, it is possible to stabilize the distance between the light emitting element 130 and the color filter layer 180 when the substrate 100 and the substrate 200 are bonded together.

Next, the substrate 100 and the substrate 200 are bonded together so that the light emitting element 130 and the color filter layer 180 overlap each other. In this case, the substrate 100 and the substrate 200 may be bonded while irradiating with ultraviolet light. In this way, it is possible to reduce the curing time of the filler material 170. Furthermore, the present embodiment is not limited to the method described above and bonding may be performed while heating. In addition, the above bonding may be carried out while applying pressure. In this way, the display device 10 is manufactured.

Second Embodiment

In the present embodiment, a display device which has a different structure from that of the first embodiment is explained. Specifically, a display device which has a partition wall layer in the periphery region is explained.

Figure 7:
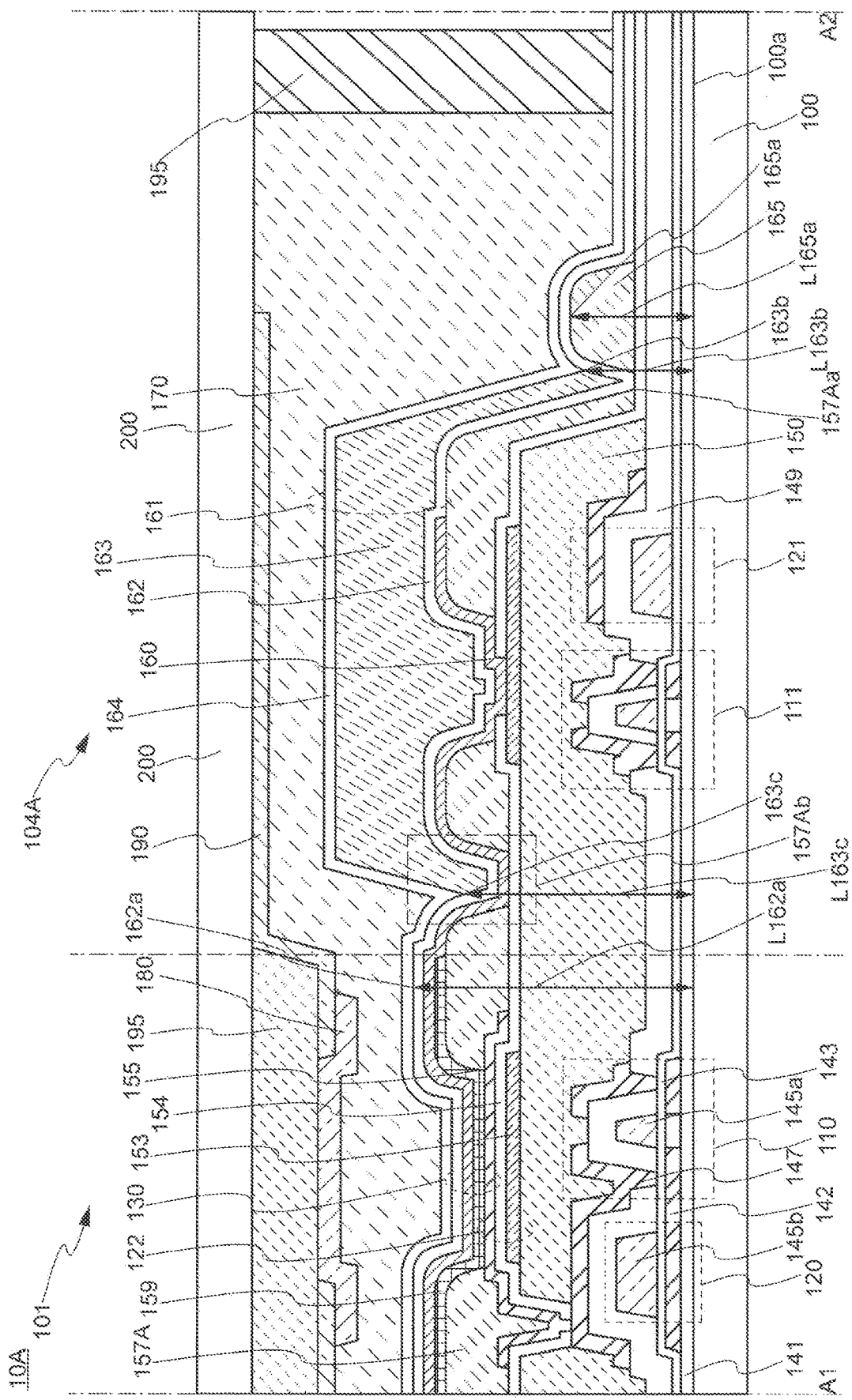
FIG. 7 is a cross-sectional diagram showing a structure of a display device related to one embodiment of the present invention.

FIG. 7 is a cross sectional diagram of the display device 10A. As is shown in FIG. 7, the display device 10A includes a display region 101, a periphery area 104A and a dam member 195.

In the display region 101, the display device 10A includes a substrate 100, a transistor 110, a capacitor 120, a capacitor 121, a light emitting element 130, an insulating layer 141, an insulating layer 149, a planarization layer 150, a rib 157A, a sealing layer 161, a filler material 170, a color filter layer 180, a light shielding layer 190, a coat layer 185 and a substrate 200. The display device 10A includes a partition wall member 165 in addition to a substrate 100, a transistor 111, a capacitor 121, an insulating layer 141, an insulating layer 149, a planarization layer 150, a rib 157A, a sealing layer 161, a filler material 170, a light shielding layer 190 and the substrate 200 in the periphery region 104A.

The partition wall member 165 is arranged below the inorganic insulating layer 164. The partition wall member 165 is arranged between the end part 157Aa of the rib 157A and the dam member 195. The partition wall member 165 and is arranged to surround the display region 101. In this case, it is preferred that a distance L165a from a first surface 100a of the substrate 100 to an upper part 165a of the partition wall member 165 is longer than a distance from the first surface 100a of the substrate 100 to a height L163b to an end part 163b of the organic insulating layer 163. In this case, the end part 163b of the organic insulating layer 163 is arranged between the rib 157A and the partition wall member 165.

In addition, the partition wall member 165 is arranged in the same layer as the rib 157A and is formed using the same material and method as the rib 157A. Therefore, the partition wall member 165 can have the same thickness as the rib 157A.

In addition, in the present embodiment, the rib 157A may include a groove part 157Ab in a region close to the display region 101. An end part 163c on the display region 101 side of the organic insulating layer 163 is arranged in the groove part 157Ab. In this case, it is preferred that a distance L163c from the first surface 100a of the substrate 100 to the end part 163c on the display region 101 side of the organic insulating layer 163 is shorter than a distance L162a from the first surface 100a of the substrate 100 to an upper surface 162a above a light emitting element 130 in the inorganic insulating layer 162 of the display region 101.

By using the present embodiment, spreading of the material to form the organic insulating layer 163 is prevented and alignment of the organic insulating layer 163 becomes easier when the organic insulating layer 163 is formed by an inkjet method or the like. Therefore, it is possible to easily manufacture the display device and improve the manufacturing yield. In addition, the display device of the present embodiment can stably have moisture blocking capabilities in the periphery region 104A.

Third Embodiment

In the present embodiment, a display device including a different structure from that of the first embodiment and the second embodiment is explained. Specifically, a display device which has a partition wall layer formed using the same material as the planarization layer in the periphery region is explained.

Figure 8:
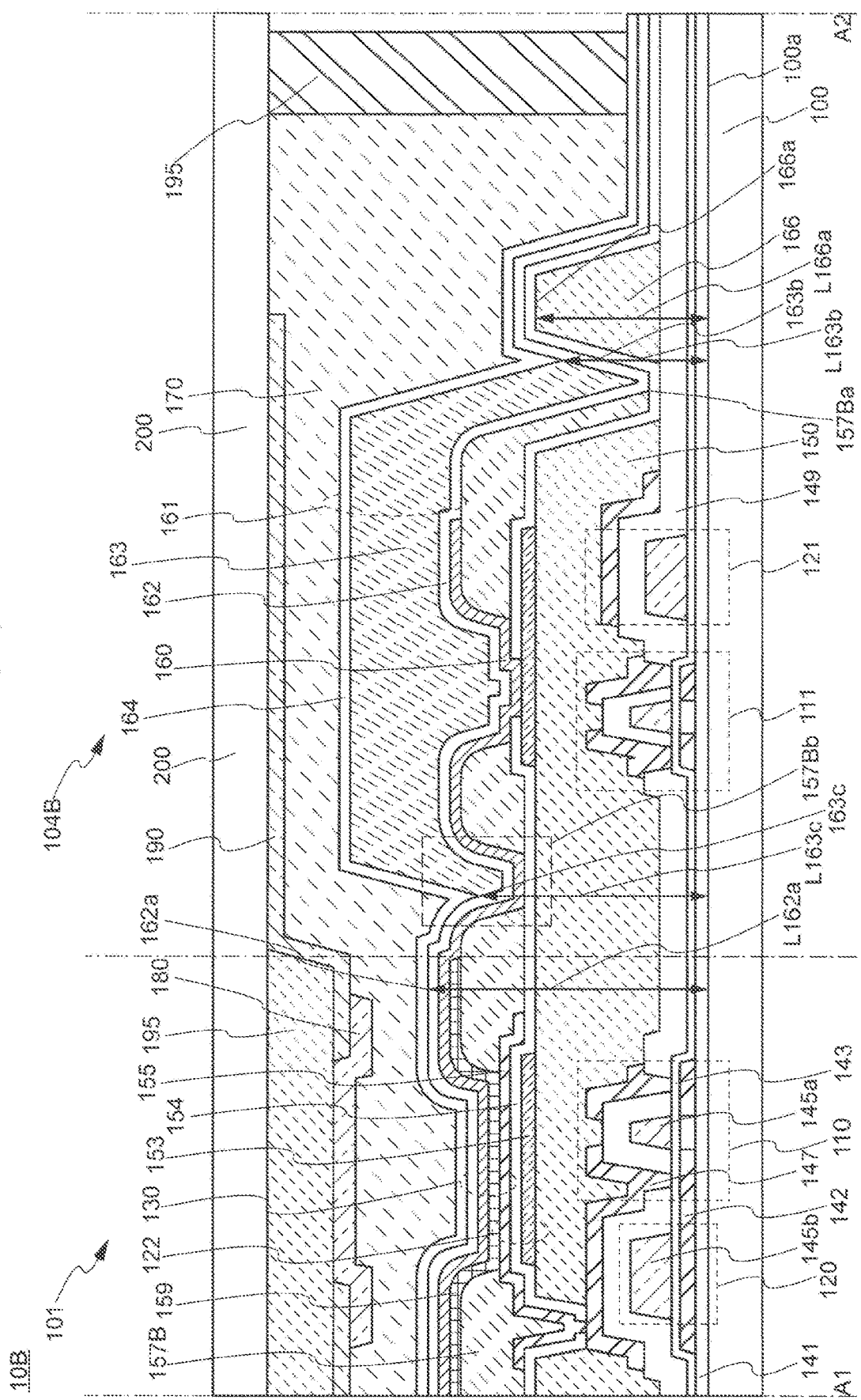
FIG. 8 is a cross-sectional diagram showing a structure of a display device related to one embodiment of the present invention.

FIG. 8 is a cross sectional diagram of a display device 10B. As is shown in FIG. 8, the display device 10B includes a display region 101, a periphery region 104B and a dam member 195.

In the display region 101, the display device 10B includes a substrate 100, a transistor 110, a capacitor 120, a capacitor 121, a light emitting element 130, an insulating layer 141, an insulating layer 149, a planarization layer 150, a rib 157B, a sealing layer 161, a filler material 170, a color filter layer 180, a light shielding layer 190, a coating layer 185 and a substrate 200. In the periphery region 104B, the display device 10B includes a partition wall member 166 in addition to the substrate 100, the transistor 111, the capacitor 121, the insulating layer 141, the insulating layer 149, the planarization layer 150, the rib 157B, the sealing layer 161, the filler material 170, the light shielding layer 190 and the substrate 200.

The partition wall member 166 is arranged on the lower side of the inorganic insulating layer 164. The partition wall member 166 is arranged between the end part 157Ba of the rib 157B and the dam member 195. In this case, a distance L166a from the first surface 100a of the substrate 100 to the upper part 166a of the partition wall member 166 is preferred to be longer than a distance L163b from the first surface 100a of the substrate 100 to the end part 163b of the organic insulating layer 163. In this case, the end part 163b of the organic insulating layer 163 is arranged between the rib 157B and the partition wall member 166.

The partition wall member 166 is arranged in the same layer as the planarization layer 150 and is formed using the same material and method as the planarization layer 150. Therefore, the partition wall member 166 can have the same thickness as the planarization layer 150.

In addition, in the present embodiment, the rib 157B may have a groove part 157Bb in a region close to the display region 101. An end part 163c on the display region 101 side of the organic insulating layer 163 is arranged in the groove part 157Bb. In this case, in the end part 163c of the organic insulating layer 163 on the display region 101 side, a distance L162a from the first surface 100a of the substrate 100 to the end part 163c of the organic insulating layer 163 on the display region 101 side is preferred to be shorter than a distance L162a from the first surface 100a of the substrate 100 to the upper surface 162a above the light emitting element 130 in the inorganic insulating layer 162 in the display region 101.

By using the present embodiment, spreading of the material to form the organic insulating layer 163 is prevented and alignment of the organic insulating layer 163 becomes easier when the organic insulating layer 163 is formed by a screen printing method or an inkjet method. Therefore, it becomes easier to manufacture the display device and improve manufacturing yield. In addition, it is possible to stabilize the moisture blocking function in the periphery region 104B.

Fourth Embodiment

In the present embodiment, a display device which has a different structure from that of the first to third embodiments is explained. Specifically, a display device which has a partition wall layer including the same material as the rib and the planarization layer in the periphery region is explained.

Figure 9:
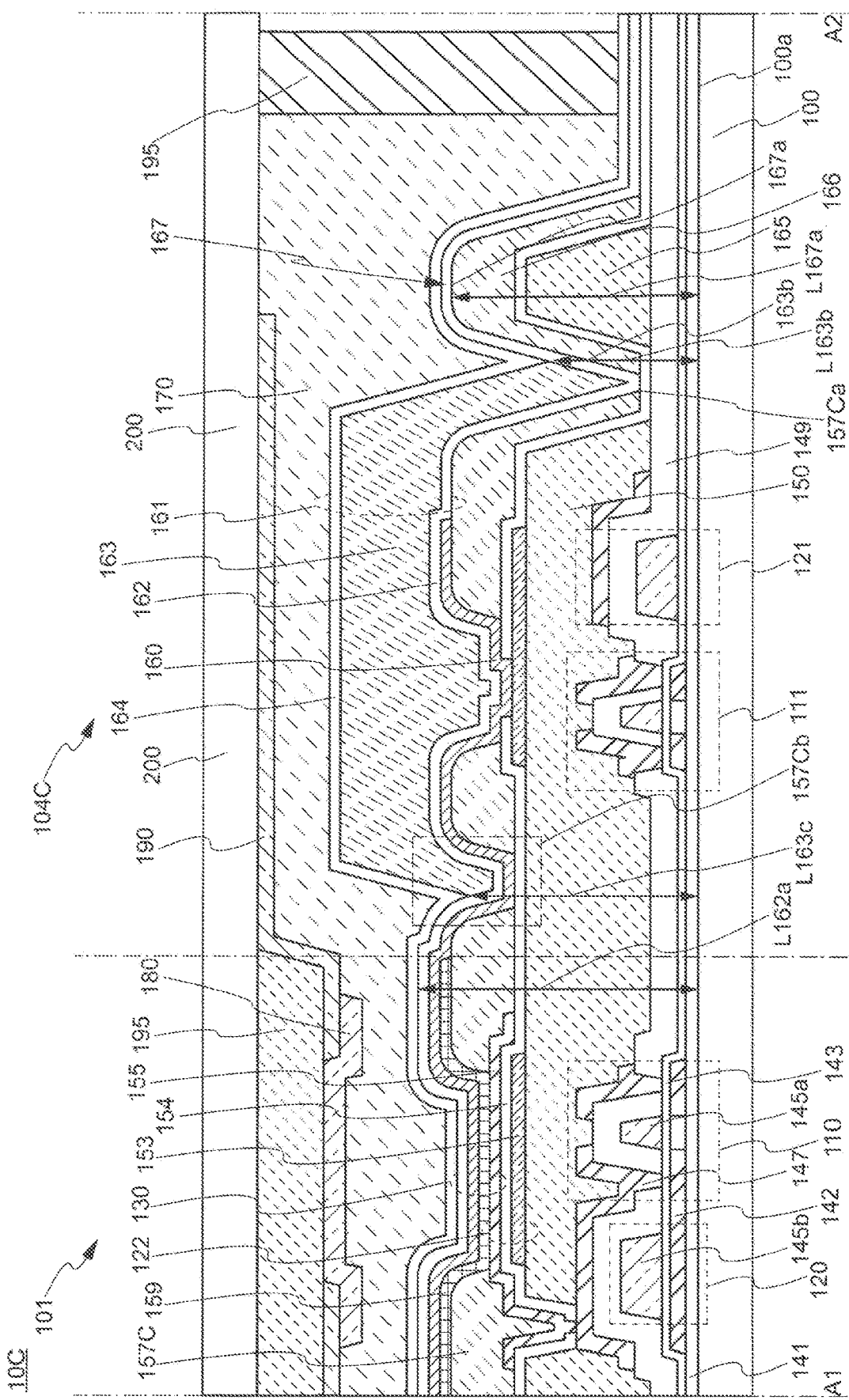
FIG. 9 is a cross-sectional diagram showing a structure of a display device related to one embodiment of the present invention.

FIG. 9 is a cross sectional diagram of a display device 100. As is shown in FIG. 9, the display device 10 C includes a display region 101, a periphery region area 104C and a dam member 195.

In the display region 101, the display device 100 includes a substrate 100, a transistor 110, a capacitor 120, a capacitor 121, a light emitting element 130, an insulating layer 141, an insulating layer 149, a planarization layer 150, a rib 157C, a sealing layer 161, a filler material 170, a color filter layer 180, a light shielding layer 190, a coating layer 185 and a substrate 200. In the periphery region 104C, the display device 100 includes a partition wall member 167 in addition to a substrate 100, a transistor 111, a capacitor 121, an insulating layer 141, an insulating layer 149, a planarization layer 150, a rib 157C, a sealing layer 161, a filler material 170, a light shielding layer 190, and the substrate 200.

The partition wall member 167 is arranged on the lower side of the inorganic insulating layer 164. The partition wall member 167 is arranged between the end part 157Ca of the rib 157C and the dam member 195. In this case, it is preferred that the distance L167a from the first surface 100a of the substrate 100 to the upper part 167a of the partition wall member 167 is longer than the distance L163b from the first surface 100a of the substrate 100 to the end part 163b of the organic insulating layer 163. In this case, the end part 163b of the organic insulating layer 163 is arranged between the rib 157C and the partition wall member 167.

The partition wall member 167 includes a partition wall member 165, an insulating layer 154 and a partition wall member 166. The partition wall member 165 is the same as that explained in the second embodiment. The partition wall member 166 is the same as that explained in the third embodiment. The insulating layer 154 is arranged between the partition wall member 165 and the partition wall member 167. The thickness of the partition wall member 167 may be the same as or more than the total value of the thickness of the planarization layer 150 and the thickness of the rib 157C. Furthermore, the partition wall member 167 does not have to include the insulating layer 154.

In addition, in the present embodiment, the rib 157C may include a groove part 157Cb in a region close to the display region 101. An end part 163c on the display region 101 side of the organic insulating layer 163 is arranged in the groove part 157Cb. In this case, it is preferred that in the end part 163c on the display region 101 side of the organic insulating layer 163, a distance L163c from the first surface 100a of the substrate 100 to the end part 163c on the display region 101 side of the organic insulating layer 163 is shorter than the distance L162a from the surface 100a of the substrate 100 to the upper surface 162a on the light emitting element 130 in the inorganic insulating layer 162 in the display region 101.

By using the present embodiment, spreading of the material to form the organic insulating layer 163 is prevented and alignment of the organic insulating layer 163 is easier when the organic insulating layer 163 is formed by a screen printing method or an inkjet method. Therefore, it is possible to easily manufacture the display device and improve the manufacturing yield. In addition, it is possible to stabilize moisture blocking function in the periphery region 104C.

A person skilled in the art in the category of the concept of the present invention could conceive various changes and modifications, and it is understood that these changes and modifications also belong to the scope of the present invention. For example, a person skilled in the art could appropriately add, delete or change the design of the constituent elements based on the display device of each embodiment, or add, omit or change conditions in a manufacturing process, as long as it does not depart from the concept of the present invention and such changes are included within the scope of the present invention.

Modified Example 1

Although an example is shown in one embodiment of the present disclosure in which the filler material 170 is arranged between the substrate 100 and the substrate 200, the filler material 170 does not need to be arranged. In this case, the display device 10 may have a hollow sealed structure including a gas at a location where the filler material 170 is arranged. In addition, the dam member 195 is not necessarily arranged when the filler material 170 is arranged.

Modified Example 2

Furthermore, a spacer or the like may be arranged in advance in order to stabilize the distance between the substrate 100 and the substrate 200. Either an organic insulating material or an inorganic insulating material may be used as the spacer.

Modified Example 3

Figure 10:
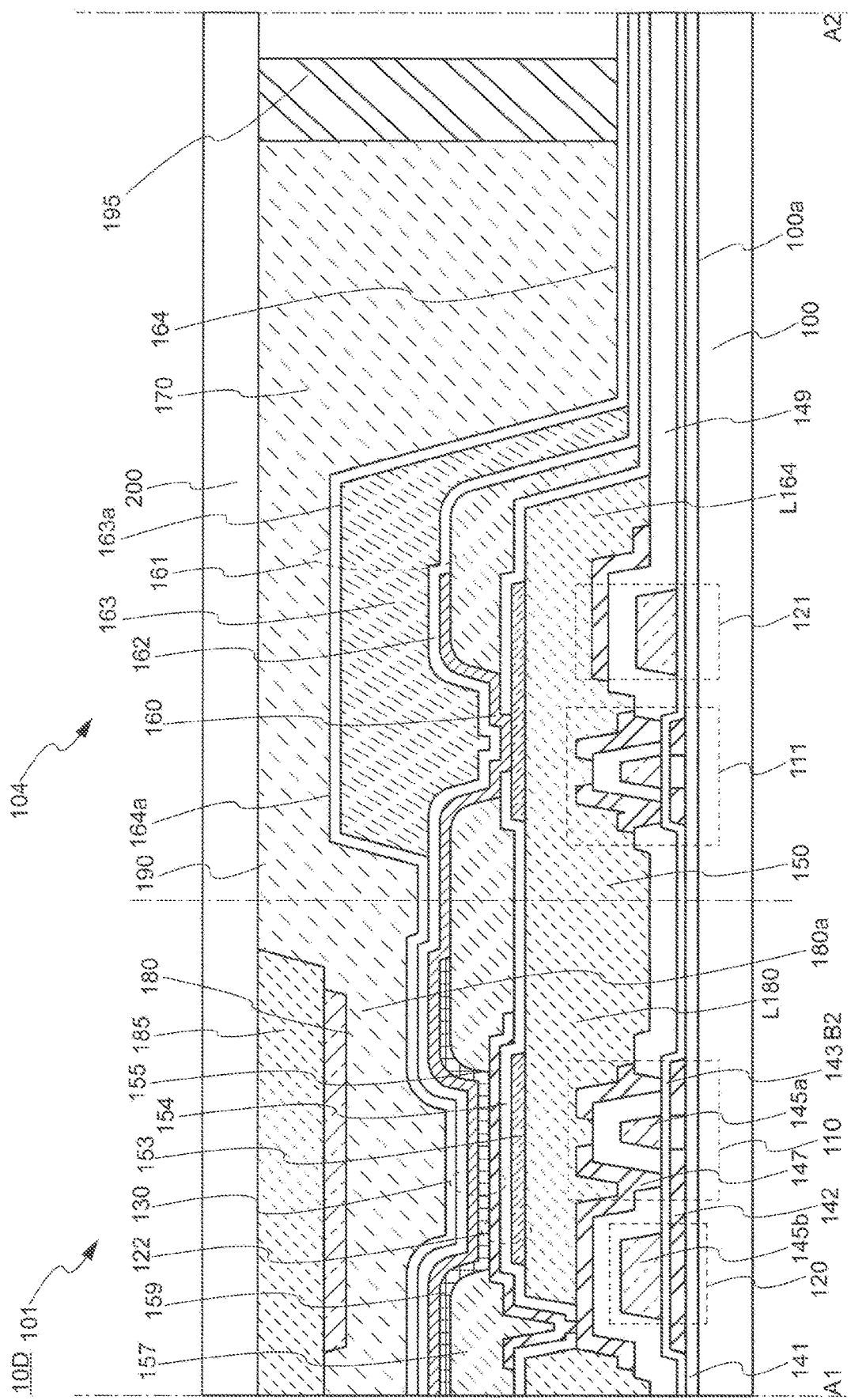
FIG. 10 is a cross-sectional diagram showing a structure of a display device related to one embodiment of the present invention.

Although an example is shown in one embodiment of the present disclosure in which the light shielding layer 190 is arranged in the display device, the present disclosure is not limited to this structure. FIG. 10 is a cross sectional diagram of a display device 10D. As is shown in FIG. 10, the light shielding layer 190 is not necessarily arranged. In this case, a display device having light translucency can be provided.

What is claimed is:

1. A display device comprising:
a first substrate;
a second substrate opposing the first substrate;
a display region including a plurality of light emitting elements arranged between the first substrate and the second substrate;
a color filter layer arranged between the plurality of light emitting elements and the second substrate in the display region, the color filter layer overlapping each of the plurality of light emitting elements respectively;
a coating layer arranged between the color filter layer and the second substrate;
a first inorganic insulating layer arranged on the plurality of light emitting elements;
a second inorganic insulating layer on the first inorganic insulating layer;
a first organic insulating layer arranged between the first inorganic insulating layer and the second inorganic insulating layer in a periphery region surrounding the display region; and
a filler material surrounding the periphery region and filling a space between the first substrate and the second substrate;
wherein
the coating layer does not overlap the first organic insulating layer.

2. The display device according to claim 1, wherein the filler material includes a first filler material and a second filler material arranged so as to surround an outside of the first filler material.

3. The display device according to claim 2, wherein the first filler material is arranged in the display region and the periphery region.

4. The display device according to claim 2, wherein the second filler material includes an inorganic material.

5. The display device according to claim 1, wherein a distance from a first surface of the first substrate to the color filter layer is shorter than a distance from the first surface of the first substrate to a part contacting an upper surface of the first inorganic insulating layer in the second inorganic insulating layer.

6. The display device according to claim 1, further comprising:
a rib separating each of the plurality of light emitting elements and the filler material; and
a partition wall arranged between an end part of the rib and the filler material, wherein
the partition wall is arranged on a lower side of the first inorganic insulating layer, and
a distance from a first surface of the first substrate to an upper part of the partition wall is longer than a distance from the first surface of the first substrate to an end part on the filler material side of the first organic insulating layer.

7. The display device according to claim 6, wherein a thickness of the partition wall is the same as a thickness of the rib.

8. The display device according to claim 6, wherein a thickness of the partition wall is the same as a thickness of a planarization layer arranged on a lower side of the plurality of light emitting elements.

9. The display device according to claim 6, wherein a thickness of the partition wall is equal to or greater than a total value of a thickness of the rib and a thickness of the planarization layer arranged on a lower side of the plurality of light emitting elements.

10. The display device according to claim 1, wherein a distance from a first surface of the first substrate to an end part of the display region side of the first organic insulating layer is shorter than a distance from the first surface of the first substrate to the first inorganic insulating layer of the display region.

11. The display device according to claim 1, wherein:
the light emitting element is an organic EL element, and
the organic EL element emits white light.

* * * * *